United States Patent
Ishizuka (10) Patent No.: US 7,472,035 B2
(45) Date of Patent: *Dec. 30, 2008

(54) METHOD FOR ANALYZING MEASUREMENT DATA OF DEVICE UNDER TEST, PROGRAM, MEASUREMENT DATA ANALYZING SYSTEM

(75) Inventor: Koji Ishizuka, Tokyo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 11 days.

This patent is subject to a terminal disclaimer.

(21) Appl. No.: 11/654,750

(22) Filed: Jan. 18, 2007

(65) Prior Publication Data

US 2007/0118323 A1    May 24, 2007

Related U.S. Application Data

(62) Division of application No. 11/102,259, filed on Apr. 8, 2005, now Pat. No. 7,184,923.

(30) Foreign Application Priority Data

Apr. 9, 2004    (JP)    ............................. 2004-116170

(51) Int. Cl.
*G06F 15/00* (2006.01)
*G01D 1/00* (2006.01)

(52) U.S. Cl. ..................... 702/127; 700/121; 702/120

(58) Field of Classification Search .................. 702/36, 702/81–84, 117–123, 127, 170, 172; 438/14, 438/151; 709/202; 700/121

See application file for complete search history.

(56) References Cited

U.S. PATENT DOCUMENTS

| | | | | |
|---|---|---|---|---|
| 5,910,895 A | * | 6/1999 | Proskauer et al. | ............ 700/121 |
| 7,043,391 B2 | * | 5/2006 | Miyazaki | ..................... 702/120 |
| 7,184,923 B2 | * | 2/2007 | Ishizuka | ..................... 702/127 |

* cited by examiner

*Primary Examiner*—John H Le
(74) *Attorney, Agent, or Firm*—Marc Bobys (57) ABSTRACT

An operation method for a semiconductor measurement apparatus having measuring, displaying, inputting, and storing devices, and a computing and controlling device connected to the other devices that performs computation and control. The method includes selecting, through the inputting device, a template for a semiconductor measurement-evaluation application displayed by the displaying device for individual technical fields; setting, through the inputting device, setting information required for execution with respect to the application templates displayed by the displaying device and of storing the setting information in the storing device; executing the application for which the setting information is stored; and storing an execution result obtained by executing the application for which the setting information is stored and execution-result attribute information into the storing device and of displaying the execution result and the execution-result attribute information on the displaying device.

6 Claims, 5 Drawing Sheets

METHOD FOR ANALYZING MEASUREMENT DATA OF DEVICE UNDER TEST, PROGRAM, MEASUREMENT DATA ANALYZING SYSTEM

CROSS REFERENCE TO RELATED APPLICATIONS

This application is a division of U.S. application Ser. No. 11/102,259, filed Apr. 8, 2005 now U.S. Pat. No. 7,184,923, the disclosure of which is incorporated herein by reference.

BACKGROUND OF THE INVENTION

1. Field of the Invention

The present invention relates to the operating environment of a measurement apparatus for measuring semiconductor devices under test. In particular, the present invention relates to a measurement apparatus for a device under test and a method using the measurement apparatus in which a user can promptly and easily understand the selection of the semiconductor measurement-evaluation application used for measuring the device under test, the setting of parameters used during execution, the display of the execution and the result of the execution, and the programming-related operations.

2. Description of the Related Art

Conventionally, measurement apparatuses that incorporate a graphical user interface (GUI) as disclosed in the Non-Patent Document "Agilent New Dimensions in Parametric Analysis, 2001 Catalog" have been commercially available for semiconductor devices under test. Those measurement apparatuses, however, require the users to have prior knowledge about the measurement, evaluation, operation of the apparatuses, and so on.

SUMMARY OF THE INVENTION

It is an object of the present invention to provide support such that a user who is not familiar with the measurement techniques and evaluation methods related to a device under test can perform desired measurement and evaluation, thereby making it possible to reduce or avoid operational errors and so on resulting from a user's misunderstanding.

The present invention provides, as an operating environment comprehensible for users in many technical fields, a measurement-apparatus operating environment which includes the selection of an application to be used for measuring the device under test, the setting of parameters to be used during execution of the application, or the display of the measurement execution and measurement execution results. The present invention further provides a method for promptly and easily performing measurement of the device under test and processing after the measurement.

In addition, the present invention provides a program creation environment for measuring a device under test as an operating environment comprehensible for users in many technical fields and further provides a method for promptly and easily performing measurement of a device under test and processing after the measurement.

Specifically, the present invention provides an operation method for a semiconductor measurement apparatus comprising measuring means, displaying means, inputting means, storing means, and computing and controlling means that is connected to the measuring means, the displaying means, the inputting means, and the storing means and that performs computation and control. The method comprises steps of: selecting a first template for a semiconductor measurement-evaluation application, through the inputting means, displayed by the displaying means for individual technical fields; setting a setting information required for execution with respect to the application template, through the inputting means, displayed by the displaying means and storing the setting information in the storing means; executing the application for which the setting information is stored; and storing an execution result obtained by executing the application for which the setting information is stored and execution-result attribute information into the storing means and displaying the execution result and the attribute information for the execution-result on the displaying means.

The step of selecting the first template may comprise a step of selecting a second template for a program corresponding to the selected application. The operation method may further include a step of newly creating a program or modifying an existing program, subsequent to the step of selecting the second template. Preferably, the step of setting and storing includes displaying a data entry field and measurement circuit diagram information displayed on the displaying means in the step of newly creating a program or modifying the existing program. Preferably, in the step of setting and storing includes displaying a data entry field and measurement circuit diagram information on the displaying means. Preferably, the step of setting and storing includes storing information of the application executed and setting information required for the application and used during the execution. In the step of the setting and storing, the storage may be performed without requesting inputting of a file name. In the step of setting and storing step, the storage may be performed without overwriting information that is previously stored. Preferably, the operation method further includes a step of displaying a stored-list in order of storage time, subsequent to the step of setting and storing. Preferably, the operation method further includes a step of selecting one of items displayed on the stored-list and displaying an application on execution and the setting information used during the execution.

Preferably, in the step of displaying, at least one of a title, an execution number, an execution time, a remark, and a mark is included in the execution-result attribute list of the execution-result. The mark may be capable of showing a symbol indicating "dubious data", "important data", or "disposable data". Preferably, the attribute list of the execution-result displayed in the step of storing and displaying is capable of showing a result obtained by sorting in terms of any attribute displayed in the attribute list of the execution-result. The operation method may further include a step of retrieving a second execution-time setting for selecting an execution result from the attribute list of the execution-result and displaying the application for the execution and setting information used during the execution on the displaying means. Preferably, the step of storing and displaying further includes a step of displaying a graph preview on the displaying means. Moreover, the step of displaying the graph preview includes showing a result of execution of execution of an application executed immediately before. Preferably, the graph preview is always displayed on the displaying means.

Herein, the term "semiconductor measurement evaluation application" refers to at least one program or a group of programs that can be executed by a computer. The program syntaxes in the program environment may be executed by a computer. For example, when a program is expressed using a flow diagram, the program syntaxes are one block unit described thereon. By combining or rearranging such program syntaxes, a user can construct a program corresponding to a desired semiconductor measurement-evaluation application.

According to the present invention, a program corresponding to a semiconductor measurement-evaluation application desired by a user can be created using the measurement apparatus. The user, therefore, does not need to construct or purchase an additional semiconductor measurement-evaluation application and incorporate the application into the measurement apparatus, thus making it possible to expedite the evaluation of a characteristic desired by the user of the device under test. In addition, the stored semiconductor measurement-evaluation applications are not classified according to "devices", such as a MOSFET (metal oxide semiconductor field-effect transistor) or a resistor, but are classified according to technical fields, such as a high-speed CMOS (complementary metal oxide semiconductor) logic, and are presented to the user. Thus, a user who is in charge of characteristic evaluation in a particular specialized field is not distracted by measurement-evaluation applications irrelevant to the characteristic evaluation. Accordingly, the user can promptly and easily select the intended measurement-evaluation application, thus making it possible to avoid failures, such as mistakenly selecting unintended measurement-evaluation applications. Additionally, when the user selects a semiconductor measurement-evaluation application, a measurement-evaluation application for a technical field associated with the semiconductor measurement-evaluation application can further be displayed. Thus, when a user who is in charge of a certain technical field performs measurement in a different technical field related to the technical field, he or she does not need to acquire the relevant knowledge in advance, thereby reducing the burden on the user. Moreover, according to the present invention, since the display and selection portion of a created semiconductor-measurement application and the display and selection portion of a template for creating an application are clearly distinguished from each other, a user can be prevented from inadvertently corrupting an application originally stored for measurement and data associated with the application. In addition, according to the present invention, the program corresponding to the measurement-evaluation application pre-stored in the storing means and a program corresponding to a measurement-evaluation application newly created by the user have the same format. Accordingly, another user can readily share and use the new application, as is the case with the measurement-evaluation application pre-stored in the storing means. Therefore, it is expected that the work efficiency between users is improved. In addition, according to the present invention, the program for the semiconductor measurement-evaluation application can be created by moving a program syntax to a predetermined location through a simple mouse operation, such as drag-and-drop. Each program syntax includes at least one command and is displayed, in the form of, for example, an icon, on the displaying means. Thus, through the mouse operation, the user can select desired program syntaxes and can combine the syntaxes to create a program corresponding to a measurement-evaluation application. The user, therefore, can readily create a program needed for a semiconductor measurement-evaluation application desired by the user, without mastering special grammar, formats, and so on in advance. In addition, according to the present invention, the view for setting and selecting the semiconductor measurement-evaluation application and the graph view for measurement data using the semiconductor measurement-evaluation application are displayed on the same screen. Thus, when setting and correcting a semiconductor measurement-evaluation application and verifying measurement data using the semiconductor measurement-evaluation application, the user does not need to switch between views on the screen. Accordingly, when the user changes the setting of the semiconductor measurement-evaluation application, it is immediately presented to the user that how measurement data varies. Thus, the user can promptly and easily give feedback for improving the semiconductor measurement-evaluation application. Additionally, according to the present invention, measurement data is automatically stored without a user caring about the file name, and is displayed in the form of a list, together with attribute information, such as execution date and time and the number of executions. Further, the list provides a function for sorting, search-refining using a condition, searching using a keyword such as data and time, and attaching marks, so that tasks such as comparison and evaluation of multiple pieces of measurement data can be smoothly executed.

DESCRIPTION OF THE PREFERRED EMBODIMENT

Figure 1:
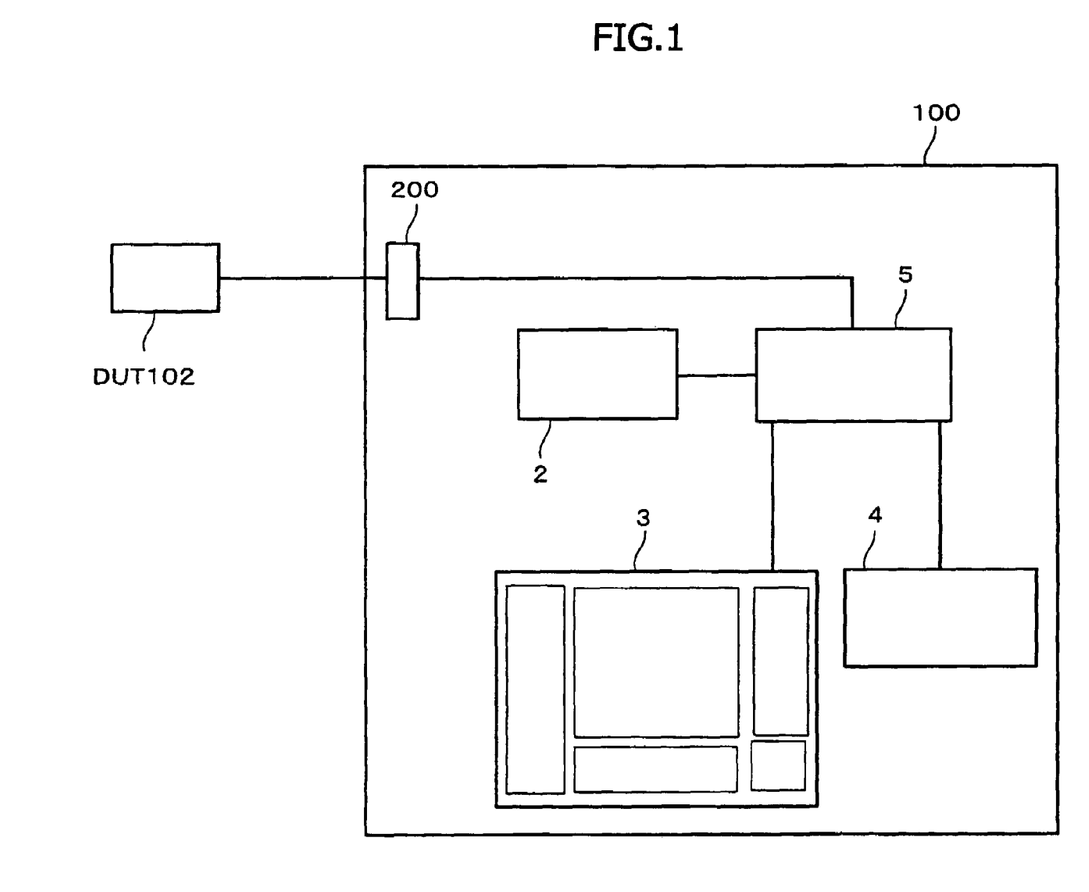
FIG. 1 is a schematic block diagram of a measurement apparatus 100 according to the present invention.

FIG. 1 shows a measurement apparatus 100 for a device under test according to the present invention. The measurement apparatus 100 includes storing means 2, displaying means 3, inputting means 4, and computing and controlling means 5. The storing means 2 stores programs corresponding to various semiconductor measurement-evaluation applications. The displaying means 3 is connected to the storing means 2 and displays information regarding the various semiconductor measurement-evaluation applications, classified for individual technical fields, and information regarding the creation or execution of programs corresponding to various semiconductor measurement applications. The inputting means 4 allows a user to select the creation or execution of at least one of the various semiconductor measurement applications and the creation or execution of a program corresponding to the semiconductor measurement application. The computing and controlling means 5 is connected to the inputting means 4 and the storing means 2 to perform predetermined computation and to control the various means that are connected thereto, in accordance with at least one of the semiconductor measurement-evaluation applications. As shown in FIG. 1, the measurement apparatus 100 can be connected to a device under test (DUT) 102 via measuring means 200.

The storing means 2 can store not only templates for programs corresponding to the various semiconductor measurement-evaluation applications, but also templates for a program corresponding to a semiconductor measurement-evaluation application that is newly created by the user. As described below, the storing means 2 can also store semiconductor measurement-evaluation application information used during the execution of measurement, i.e., data set for the parameters and various types of data and information required for executing a program and so on used in the application.

When a program corresponding to a semiconductor measurement application is created, the displaying means 3 can display a list of program syntaxes. When a program is executed, the displaying means 3 can display parameters for the semiconductor measurement application or a list of measurement data obtained from the semiconductor measurement application. That is, the displaying means 3 is adapted to allow the user to check what type of task is to be performed on a semiconductor measurement application selected by the user and to display corresponding information.

The inputting means 4 may include a keyboard, a mouse, a touch panel, or the like. Thus, the inputting means 4 may be integrated with the displaying means 3. Using the inputting means 4, the user performs an operation for evaluating characteristics of the device under test 102, through GUI (graphical user interface) components (described below) and so on displayed on the displaying means 3. For example, using the inputting means 4, the user can select a template for a semiconductor measurement-evaluation application stored in the storing means 2, select a template for a program corresponding to the selected application, and set setting information required for executing the application.

Figure 2:
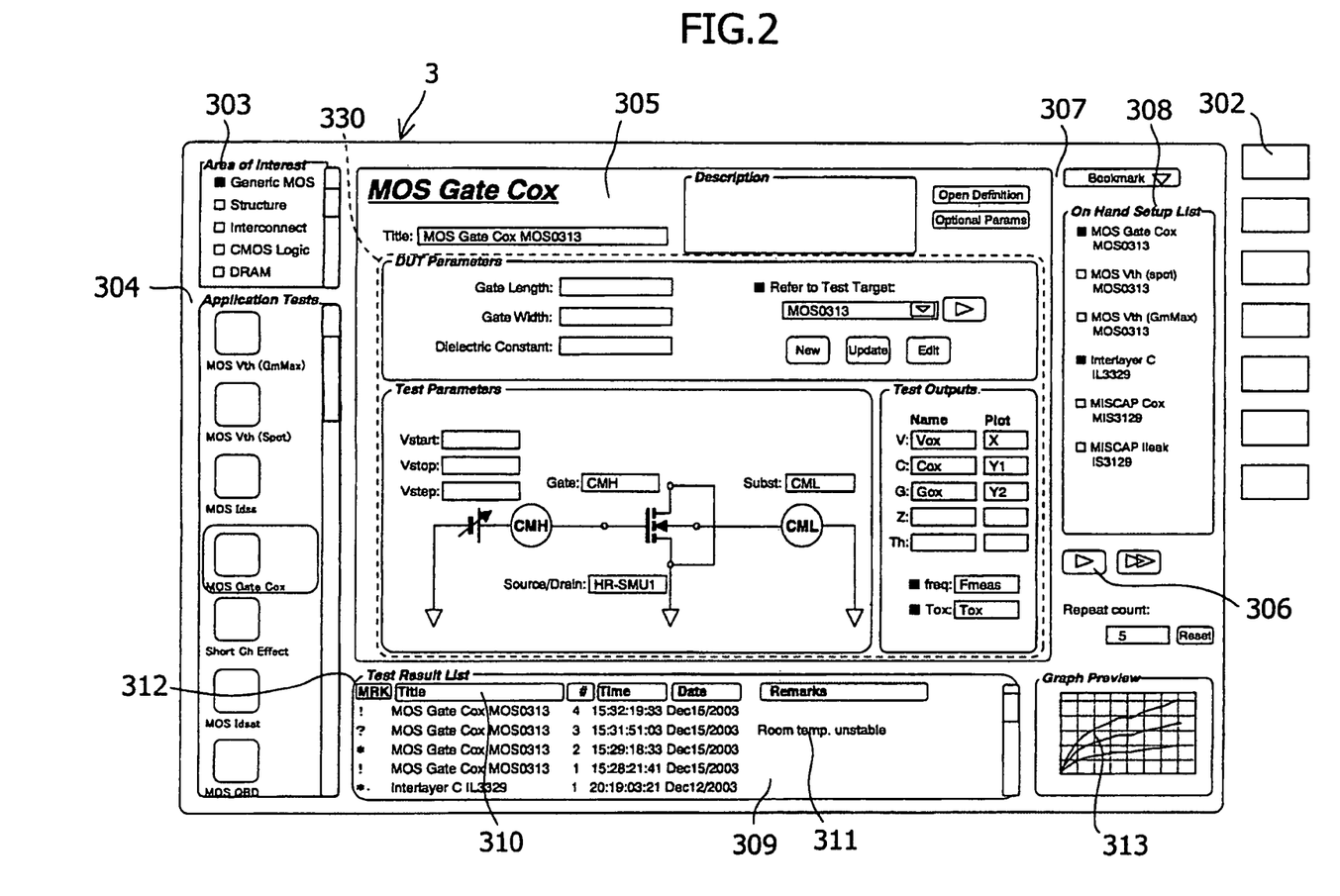
FIG. 2 is a schematic view showing a specific view output on a displaying means 3 of the measurement apparatus 100 according to the present invention.

FIG. 2 shows details of the displaying means 3. The displaying means 3 displays a GUI 303 for selecting the technical field desired by the user, a GUI 304 for selecting an application classified in the selected technical field, a GUI 305 for performing setting for the selected application, a GUI button 306 for starting the execution of the application, a GUI button 307 for bookmarking the current application settings in an on-hand setup list, and a GUI 308 for displaying and selecting the application settings currently registered in the on-hand setup list. The displaying means 3 further displays a GUI 309 for a "test result list" in which measurement results are heaped, a GUI button group 310 for sorting and filtering items in the test result list, remarks 311 appended to the items in the test result list, marks 312 added to the items in the test result list, and a graph 313 for previewing the measurement result data. Moreover, as shown in FIG. 2, a hardware button group 302 is arranged adjacent to the displaying means 3 of the present invention and each hardware button can be associated with the corresponding semiconductor measurement-evaluation application. Selecting one button of the hardware button group 302 allows immediate launching of the semiconductor measurement-evaluation application associated with the button.

The storing means 2 of the measurement apparatus 100 of the present invention pre-stores templates for many semiconductor measurement-evaluation applications which are likely to be used by end users. This is because in recent semiconductor technology development users are specialized into a large number of related technical fields, meaning that in many cases multiple users will use the semiconductor measurement-evaluation application for the technical field which a particular user is involved with. Semiconductor measurement-evaluation application templates stored in the storing means 2 are categorized and displayed for each technical field, as shown in the GUI 303 in FIG. 2. Thus, consideration is given such that a specific user will not be distracted by semiconductor measurement-evaluation applications from other technical fields. When a user checks the GUI box for an item corresponding to the technical field in which the user specializes, templates for an application belonging to that technical field are listed in the GUI 304.

Selecting one item from the list of semiconductor measurement-evaluation application templates shown in the GUI 304 causes a GUI for setting the application to be displayed in the area of the GUI 305. In the GUI, for example, a series of entry fields for setting parameters used during the execution of a semiconductor measurement-evaluation application are displayed together with text and graphics illustrating the contents of the semiconductor measurement-evaluation application. Thus, by entering a desired value in each field, the user can readily set parameters for the semiconductor measurement-evaluation application. The display of the GUI 305 and the type and arrangement of the entry fields can be configured so as to be suitable for each semiconductor measurement-evaluation application.

After completing the setting in the region of the GUI 305, the user can start measurement using the measurement-evaluation application by pressing a button shown in the GUI 306. The user can also repeat measurement, while modifying the values pre-set in the area shown in the GUI 305 until a desired result is obtained, replacing devices under test, and changing measurement conditions, such as the temperature. Measurement data thus obtained is plotted in the form of a line graph, a scatter plot, or the like on the preview graph 313, so that the user can detect the presence of any failure, an input error of a parameter value, and so on during measurement. The preview graph 313 can also be enlarged as required.

All of the measurement data obtained as described above are automatically stored by the measuring means 2. At this point, the name of the measurement-evaluation application, a title given by the user, the date and time when the measurement is performed, a value indicating a measurement-execution number, and so on are sequentially added to the area 309 for display. The list displayed in the area 309 is hereinafter referred to as an "execution-result attribute list". In addition to the contents displayed, for example, at the end of measurement, remarks regarding a measurement result can also be attached to measurement data, as indicated by reference numeral 311. Similarly, for example, at the end of measurement, a symbol, i.e., a mark, as indicated by reference numeral 312, can also be attached to a measurement result. Such a mark can be attached by selecting a mark in the execution-result attribute list 309 in the dialog box displayed at the end of measurement or by the user clicking the position of the mark on the measurement result list at the end of measurement, to thereby display a menu or dialog for mark selection. Such marks are displayed in such a manner that indications of "dubious data", "important data", "disposable data", or the like are displayed in the dialog box. With this arrangement, the user can apply a mark to a desired row in the execution-result attribute list 309 in a short period of time. Based on the mark, the user can readily search for specific measurement data from the execution-result attribute list 309. Therefore, the user can readily retrieve the type and setting of the present measurement-evaluation application and the resulting measurement data into, for example, the setting area 305 and the graph plot area 313. As described above, the execution-result attribute list 309 includes titles for measurements executed, date and time of execution, execution numbers, remarks, and marks.

For searching for previous measurement data from the execution-result attribute list 309, the use of the GUI indicated by reference numeral 310 allows the displayed information, such as the titles, dates and times, execution numbers, remarks, or marks, to be sorted in a descending or ascending order. Among the above-noted items, only items that satisfy certain conditions can be displayed or searched for. Moreover, the arrangement is such that previous measurement data found from the execution-result attribute list 309 is selected, setting information for the measurement is retrieved to the area of GUI 305, and the application is executed again. Thus, to again execute an application that has been already created, there are two methods: 1) selection from an on-hand setup list and 2) selection from the execution-result attribute list 309.

When the setting of a parameter or the like in the area 305 shown in FIG. 2 is changed multiple times to repeat measurement and, furthermore, a parameter or the like suitable for the measurement is set consequently, operating the "bookmark" GUI button indicated by reference numeral 307 allows the set content to be automatically registered in the on-hand setup list. The contents of the on-hand setup list are displayed in the area 308. Thus, with respect to setting of parameters for the same semiconductor measurement-evaluation application, various settings can be registered in the on-hand setup list as a multiple-setting list. Titles listed in the area 308 can be changed to desired titles. The bookmark GUI button 307 has a function for storing the contents of parameter settings for the present semiconductor measurement-evaluation applications without a user having to particularly recognize the file name, i.e., a function for storing the contents of parameter settings without overwriting the setting contents of all parameters during the operation of the button 307. In addition, upon pressing of the bookmark GUI button 307, various types of data and information required for executing a program and so on used in the application are also stored in the on-hand setup list. As a result, it is possible to clearly distinguish an application template from an application pre-set and stored for execution.

Using the list 308, the user can bookmark and register settings for an arbitrary number of semiconductor measurement-evaluation applications. Thus, the user can retrieve an arbitrary item in the list 308 to the area 305. Also, even when the same operation is performed in the future, a desired measurement-evaluation application can be readily retrieved and operational errors can be avoided.

Further, operating the GUI button 306 allows an item selected from the list 308 to be immediately executed. Moreover, it is also possible to check some of the GUI boxes for items on the list 308 so that the checked items are automatically executed in sequence.

In addition, items on the list 308 can be associated with the hardware button group 302. Pressing one of the hardware buttons 302 allows the launching of a program corresponding to a semiconductor measurement application associated with the hardware button. In this case, some of the higher order items in the list 308 or some of the higher-order items selected by the user from the list can be directly associated with the hardware button group 302.

When the number of hardware buttons 302 is larger than the number of semiconductor measurement-evaluation applications with which the user wishes to associate, a feature indicating "More . . . " or the like can be automatically assigned to the last button of the hardware button group 302. Pressing this button causes switching to a "link to next predetermined items", so that the hardware buttons 302 are assigned to the remaining application test settings. Such processing can also be repeated until all the semiconductor measurement-evaluation applications have been associated with the respective hardware buttons 302.

Creating and editing a program corresponding to the semiconductor measurement-evaluation application will now be described with reference to FIG. 3. In this case, the view shown in FIG. 2 and the view shown in FIG. 3 can be switched using a menu command located on a menu bar (not shown) of a main menu at the top of the screen. The user can create a user-specific semiconductor measurement-evaluation application by, for example, adding a new program syntax to the semiconductor measurement-revaluation application stored in the storing means 2. Reference numeral 314 indicates a GUI for allowing the user to create or edit a program corresponding to a new semiconductor measurement-evaluation application. A list of available syntaxes of program elements indicated by reference numeral 315 can also be displayed adjacent to the GUI 314.

Figure 3:
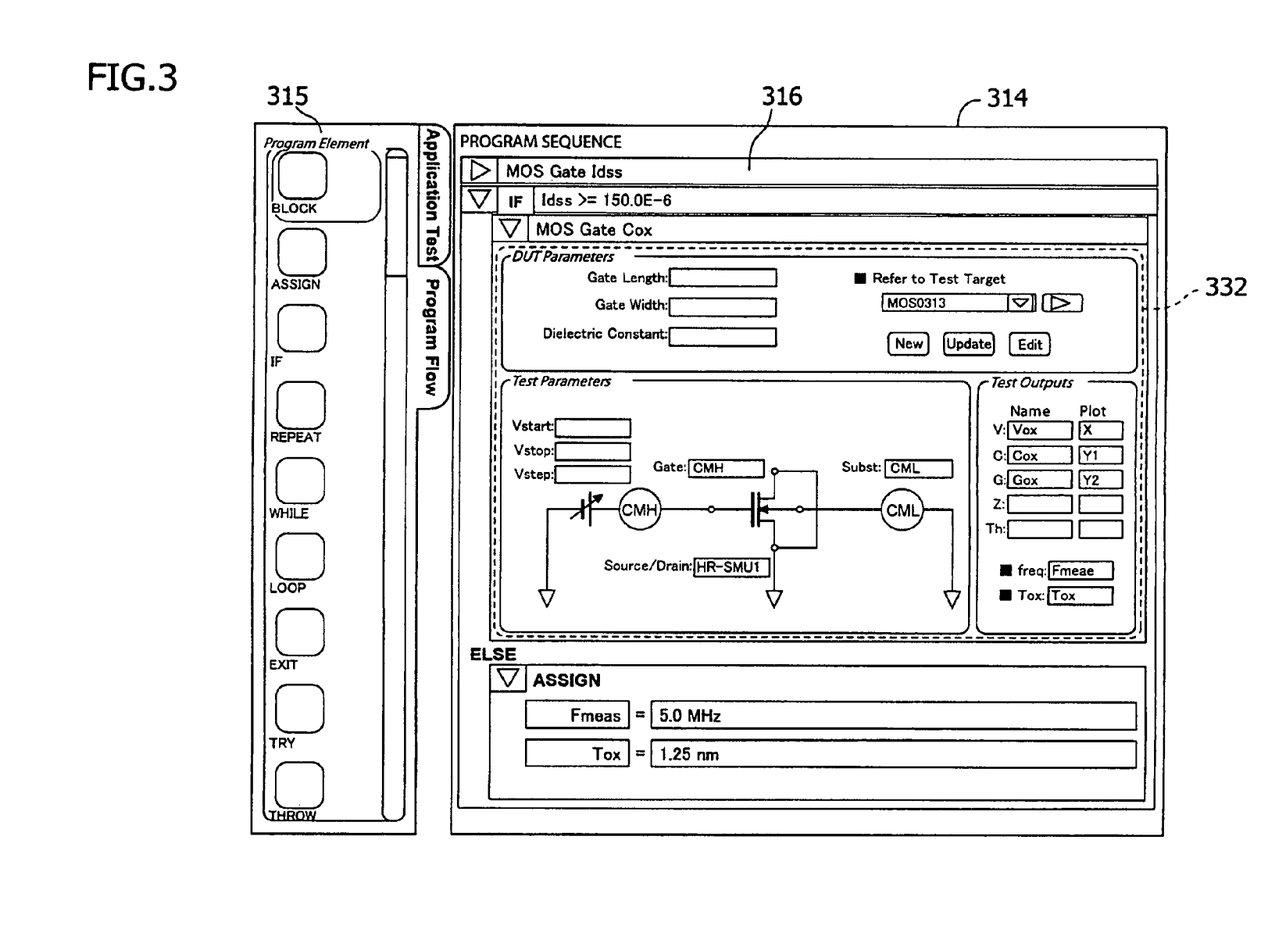
FIG. 3 is a schematic view showing a case in which the creation of a program corresponding to a semiconductor measurement-evaluation application is selected on the displaying means 3 of the measurement apparatus 100 according to the present invention.

In this case, performing an operation such that a "program flow" tab shown in FIG. 3 appears above an "application test" tab causes the list in the "program flow" tab to be displayed. Through a mouse operation such as drag-and-drop, the user can select at least one program syntax found in the program flow tab, so that the program syntax is moved to a program edit area 316. Each program syntax illustrated is displayed, in the form of an icon, on the screen of the displaying means 2.

Next, a description is given of a method for incorporating a program newly created by the user into an existing semiconductor measurement-evaluation application. The user performs programming by selecting a desired program syntax from the set of program syntax templates 315 and moving the selected program syntax to a predetermined position in the program edit area 316 through a mouth operation. It is to be noted that FIG. 3 shows a state in which a new program corresponding to an application is created rather than the programs 304 that are shown in FIG. 2 and that correspond to semiconductor measurement-evaluation applications pre-stored in the storing means 2. An icon selected (i.e., indicated by "BLOCK" at reference numeral 315) is not particularly linked to an IF-ELSE syntax found in the area 316. The user can add a program syntax by moving the selected icon indicated by reference numeral 315 to the program edit area 316, through an operation, such as copy-and-paste or drag-and-drop using the mouse.

Figure 4:
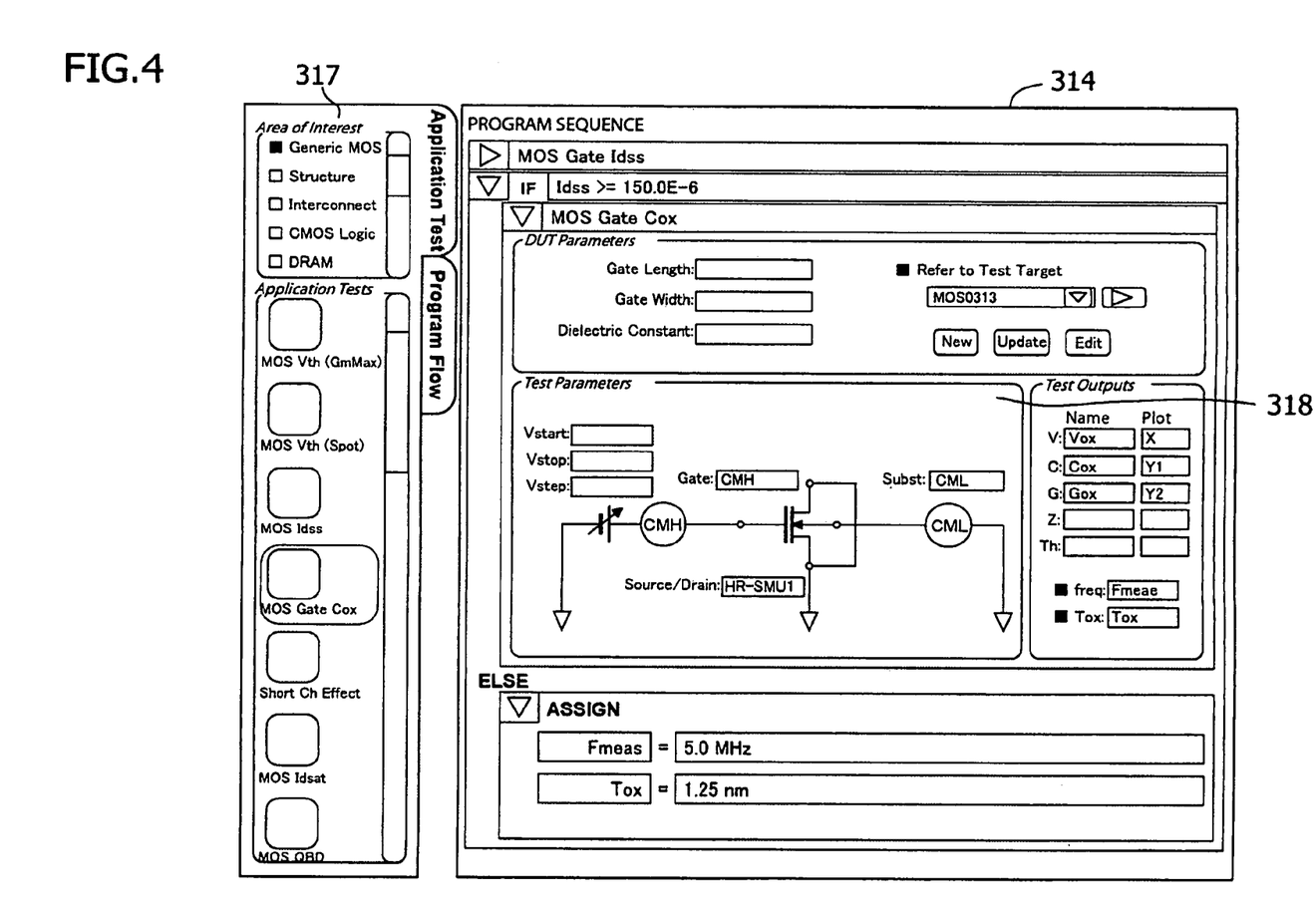
FIG. 4 is a schematic view showing a case in which the execution of a program corresponding to a semiconductor measurement-evaluation application is selected on the displaying means 3 of the measurement apparatus 100 according to the present invention.

Similarly, when the user desires to retrieve an existing semiconductor measurement-evaluation application into the program, as indicated by reference numeral 317 shown in FIG. 4, he or she performs switching such that the "application test" tab for selecting a semiconductor measurement-evaluation application appears in front of the "program flow tab" on the screen, indicated by reference numeral 315 shown in FIG. 3. Since a list indicated by reference numeral 317 has the same configuration as the lists 303 and 304, the user can readily retrieve a program corresponding to a newly created semiconductor measurement-evaluation application, in the same manner as for selecting a semiconductor measurement-evaluation application pre-stored in the storing means 2. Further, a view for a corresponding measurement module for a programming environment indicated by a dotted line 332 in FIG. 3 (in this example, a view for a programming environment for a measurement module "MOS gate Cox", which is one type of subroutine) and a view for setting parameters used during the execution and indicated by a dotted line 330 in FIG. 2 (i.e., a view for setting parameters for MOS Gate Cox) can be displayed on the screen in similar formats. Accordingly, the user can create a program corresponding to a semiconductor measurement-evaluation application in the same manner as for executing a semiconductor measurement-evaluation application.

Figure 5:
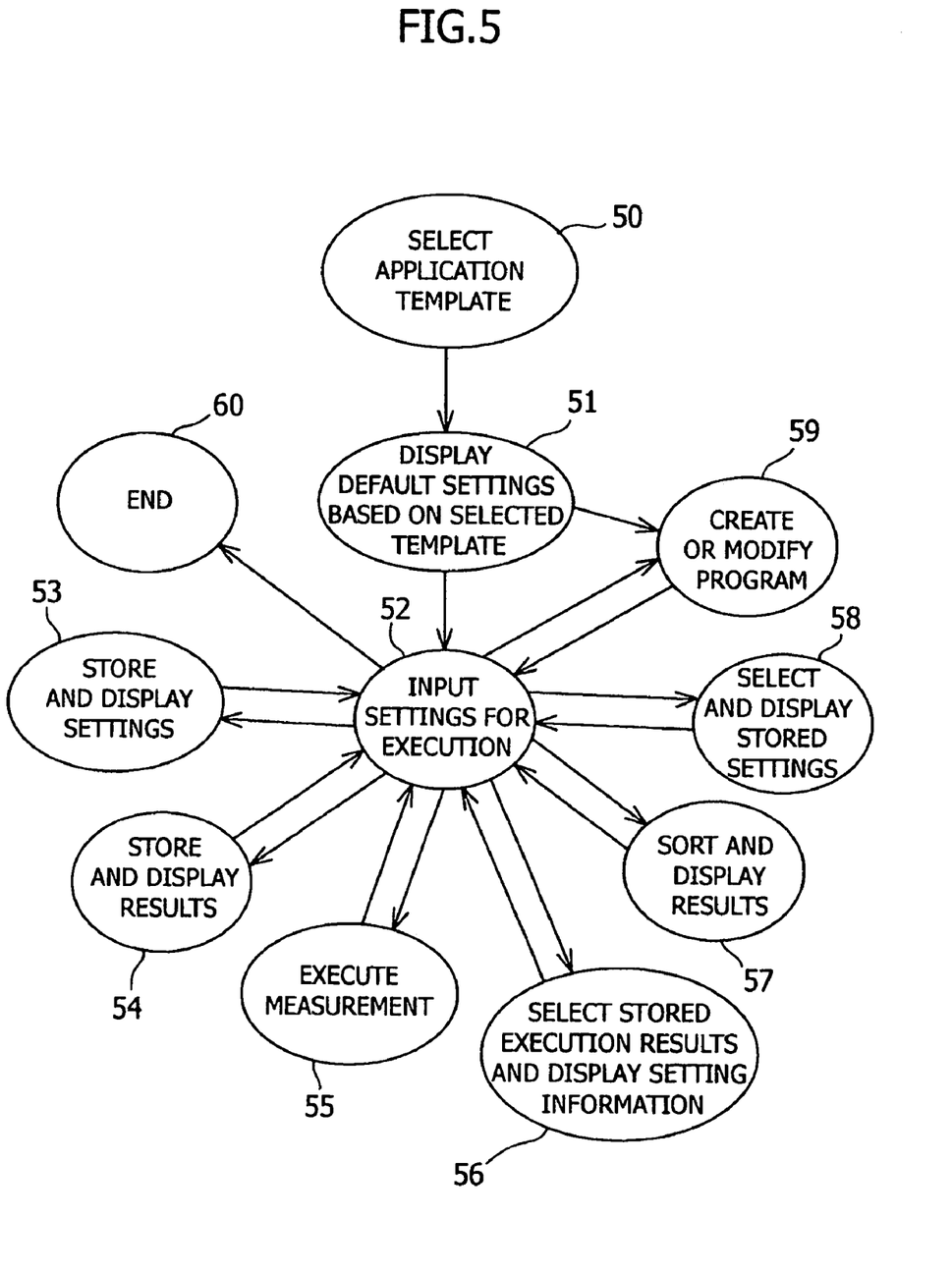
FIG. 5 is a flow chart showing a method for measurement using the measurement apparatus 100 according to the present invention.

Lastly, an overview of a method that uses the measurement apparatus 100 for analyzing measurement data of a device under test will be described with reference to FIG. 5. First, in step 50, the user selects an application template. In step 51, default settings based on the selected template are displayed.

In step 52, settings for execution are input. Step 52 is linked with steps 53 to 59 described below and thus the flow can go back and forth therebetween. In step 53, the settings used during execution are stored and displayed. In step 55, measurement is executed. In step 54, the result of measurement performed immediately before is stored and displayed. In step 56, an execution result previously stored is selected and setting information is displayed. In step 57, the measurement result is sorted and displayed. In step 58, settings previously stored are selected and displayed. In step 59, a program is created or modified. As indicated by the arrow from step 51 to step 59, the flow can proceed to step 59 without going through step 52. In this case, for example, setting information and a result obtained by execution of an application can be displayed on the displaying means 3, through the use of a graph preview. This graph preview can not only indicate the execution result of an application executed immediately before, but also the execution result of an application executed prior thereto. Also, such a graph preview can be displayed constantly on the displaying means 3. When the end of operation is selected in step 52, the operation is finished in step 60. As described above, according to the present invention, the creation and execution of an application and the concurrent creation and editing of a program can be sequentially performed in a smooth manner. The steps described above can also be automatically executed using a computer-readable program.

While the embodiment of the present invention has been described above, it is to be understood that the embodiment described above is intended to be merely illustrative. For example, with respect to the contents of information such as parameters stored by bookmarking, only information of an essential part of a corresponding application may be used instead of all information of the application.

What is claimed is:

1. An operation method for a semiconductor measurement apparatus comprising measuring means, displaying means, inputting means, storing means, and computing and controlling means which is connected to the measuring means, the displaying means, the inputting means, and the storing means and which performs computation and control, the method comprising:

selecting a first template for a semiconductor measurement-evaluation application, through the inputting means, displayed by the displaying means for individual technical fields, the template being for a technical field related to the semiconductor device to be tested, wherein selecting the first template is executed prior to setting a setting a information, executing an application, storing an execution result, and displaying the execution result;

the method further comprising:

setting a setting information required for execution with respect to the application templates, through the inputting means, displayed by the displaying means and storing the setting information in the storing means;

executing the application for which the setting information is stored; and storing an execution result obtained by executing the application for which the setting information is stored and the attribute information for the execution result into the storing means, and displaying the execution result and the attribute information for the execution-result on the displaying means.

2. The operation method according to claim 1, wherein selecting the first template comprises selecting a second template for a program corresponding to the selected application.

3. The operation method according to claim 2, further comprising newly creating a program or modifying an existing program, subsequent to selecting the second template.

4. The operation method according to claim 1, wherein setting and storing includes storing information of the application executed and the setting information required for the application and used during the execution.

5. The operation method according to claim 1, wherein storing an execution result and displaying the execution result further comprises displaying a graph preview on the displaying means.

6. The operation method according to claim 5, wherein the graph preview is always displayed on the displaying means.

* * * * *

UNITED STATES PATENT AND TRADEMARK OFFICE
CERTIFICATE OF CORRECTION

| | |
|---|---|
| PATENT NO. | : 7,472,035 B2 |
| APPLICATION NO. | : 11/654750 |
| DATED | : December 30, 2008 |
| INVENTOR(S) | : Ishizuka |

Page 1 of 1

It is certified that error appears in the above-identified patent and that said Letters Patent is hereby corrected as shown below:

In column 10, line 10, in Claim 1, after "setting" delete "a".

Signed and Sealed this

Twenty-first Day of April, 2009

JOHN DOLL
*Acting Director of the United States Patent and Trademark Office*